(12) United States Patent
Sato et al.

(10) Patent No.: US 12,185,457 B2
(45) Date of Patent: Dec. 31, 2024

(54) CONTROL UNIT HAVING A WIRING BOARD ON WHICH A CONNECTOR IS DISPOSED

(71) Applicants: JATCO Ltd, Fuji (JP); NISSAN MOTOR CO., LTD., Yokohama (JP)

(72) Inventors: Yusuke Sato, Sagamihara (JP); Hideyuki Mamiya, Mishima (JP); Katsunori Yamashita, Chigasaki (JP); Hirohisa Yukawa, Machida (JP); Akira Suwabayashi, Isehara (JP)

(73) Assignees: JATCO LTD, Fuji (JP); NISSAN MOTOR CO., LTD., Yokohama (JP)

( * ) Notice: Subject to any disclaimer, the term of this patent is extended or adjusted under 35 U.S.C. 154(b) by 281 days.

(21) Appl. No.: 17/610,387

(22) PCT Filed: Jun. 2, 2020

(86) PCT No.: PCT/JP2020/021741
§ 371 (c)(1),
(2) Date: Nov. 10, 2021

(87) PCT Pub. No.: WO2020/246458
PCT Pub. Date: Dec. 10, 2020

(65) Prior Publication Data
US 2022/0248529 A1  Aug. 4, 2022

(30) Foreign Application Priority Data
Jun. 6, 2019  (JP) .................. 2019-106154

(51) Int. Cl.
*H05K 1/02* (2006.01)
*H05K 1/18* (2006.01)

(52) U.S. Cl.
CPC .......... *H05K 1/0278* (2013.01); *H05K 1/189* (2013.01); *H05K 2201/10189* (2013.01)

(58) Field of Classification Search
CPC ................. H05K 1/0278; H05K 1/189; H05K 2201/10189
See application file for complete search history.

(56) References Cited

U.S. PATENT DOCUMENTS

| | | | |
|---|---|---|---|
| 6,223,841 B1 * | 5/2001 | Susag | E02F 9/0883 |
| | | | 180/53.4 |
| 8,757,956 B2 * | 6/2014 | Thompson | E02F 9/2275 |
| | | | 414/696 |
| 9,545,020 B2 * | 1/2017 | Kanzaki | H05K 5/0069 |
| 9,692,151 B2 * | 6/2017 | Kunieda | H01R 24/46 |

(Continued)

FOREIGN PATENT DOCUMENTS

| | | |
|---|---|---|
| JP | H10-332018 A | 12/1998 |
| JP | 2001-271918 A | 10/2001 |

(Continued)

*Primary Examiner* — Rockshana D Chowdhury
*Assistant Examiner* — Douglas R Burtner
(74) *Attorney, Agent, or Firm* — Foley & Lardner LLP

(57) ABSTRACT

The control unit includes a wiring board on which a connector is disposed. The connector is disposed on a back surface of the wiring board, the back surface being a back surface on a back side of a facing surface facing a body of the control unit. The wiring board includes legs protruding from the back surface on the back side of the facing surface facing the body.

8 Claims, 7 Drawing Sheets

(56) References Cited

U.S. PATENT DOCUMENTS

| | | | |
|---|---|---|---|
| 9,768,534 B2* | 9/2017 | Kurachi | H01R 12/7005 |
| 9,924,054 B2* | 3/2018 | Shigeno | H04N 1/0083 |
| 10,030,365 B2* | 7/2018 | Okura | E02F 9/2275 |
| 10,122,134 B2* | 11/2018 | Shibuya | H01R 13/28 |
| 10,418,732 B2* | 9/2019 | Arakawa | H01R 12/732 |
| 10,498,058 B1* | 12/2019 | Kitazawa | H01R 13/6594 |
| 10,581,184 B2* | 3/2020 | Tsukashima | H01R 13/20 |
| 10,845,611 B2* | 11/2020 | Minamisawa | G02B 27/646 |
| 10,998,655 B2* | 5/2021 | Minai | H01R 12/71 |
| 11,011,874 B2* | 5/2021 | Kitazawa | H01R 12/716 |
| 11,095,059 B2* | 8/2021 | Gondo | H01R 12/707 |
| 11,202,379 B2* | 12/2021 | Endo | G06F 1/1616 |
| 11,413,955 B2* | 8/2022 | Yamamoto | F01P 3/18 |
| 11,569,620 B2* | 1/2023 | Masunaga | H01R 13/6582 |
| 11,866,101 B2* | 1/2024 | Aihara | B60N 3/048 |
| 2009/0163147 A1* | 6/2009 | Steigerwald | H05K 1/0219 |
| | | | 455/73 |
| 2013/0058090 A1* | 3/2013 | Ferrie | F21V 3/04 |
| | | | 362/249.02 |
| 2013/0242513 A1* | 9/2013 | Masuda | H05K 1/14 |
| | | | 361/752 |
| 2014/0186151 A1* | 7/2014 | Ootsuka | E02F 9/2285 |
| | | | 414/685 |
| 2017/0138583 A1* | 5/2017 | Ito | H01L 33/52 |
| 2018/0332731 A1* | 11/2018 | Kita | H05K 7/1427 |
| 2020/0365866 A1* | 11/2020 | Lin | H05K 1/028 |

FOREIGN PATENT DOCUMENTS

| | | |
|---|---|---|
| JP | 2005-286242 A | 10/2005 |
| JP | 2012-017828 A | 1/2012 |

* cited by examiner

CONTROL UNIT HAVING A WIRING BOARD ON WHICH A CONNECTOR IS DISPOSED

TECHNICAL FIELD

The present invention relates to a control unit.

BACKGROUND ART

A power transmission device includes a case housing a transmission and the like, and an automatic transmission fluid (ATF, hereinafter simply referred to as "oil") used for lubrication, cooling, torque transmission, and the like is stored inside the case.

A control valve unit that regulates a pressure of the oil and circulates the oil in the case is housed in the case. The control valve unit is provided with a large number of electric components such as sensors and actuators, and a wiring board that bundles and fixes wires for energizing or transmitting a signal to each of the electric components is separately provided (see, for example, Patent Literature 1).

CITATION LIST

Patent Literature

Patent Literature 1: JP2005-286242A

SUMMARY OF INVENTION

A wiring board may be provided with a connector connected to the wire.

A control valve unit may be removed from a case and placed on a flat surface such as a work table or a floor during maintenance or the like of a transmission. The flexible wire has a high load bearing capacity, whereas the connector has a lower load bearing capacity than the wire. Therefore, there is a demand to protect the connector from a large load when the control valve unit is placed on the flat surface for maintenance or the like.

According to an aspect of the present invention, a control unit includes a wiring board on which a connector is disposed, wherein
    the connector is disposed on a back surface of the wiring board, the back surface being a surface on a back side of a facing surface of the wiring board facing a body of the control unit, and
    the wiring board includes a leg protruding from the back surface on the back side of the facing surface facing the body.

According to an aspect of the present invention, when the control valve unit is placed on a flat surface with the connector facing downward, a load applied to the connector can be reduced since the leg receives a part of the load.

DESCRIPTION OF EMBODIMENTS

A control unit is, for example, a control valve unit provided for hydraulic control of a transmission, an inverter (inverter unit) provided for control of a driving motor of an electric vehicle or a hybrid vehicle, or the like.

In the following embodiments, a control valve unit provided in a power transmission device such as a transmission will be described as an example of the control unit.

Figure 1:
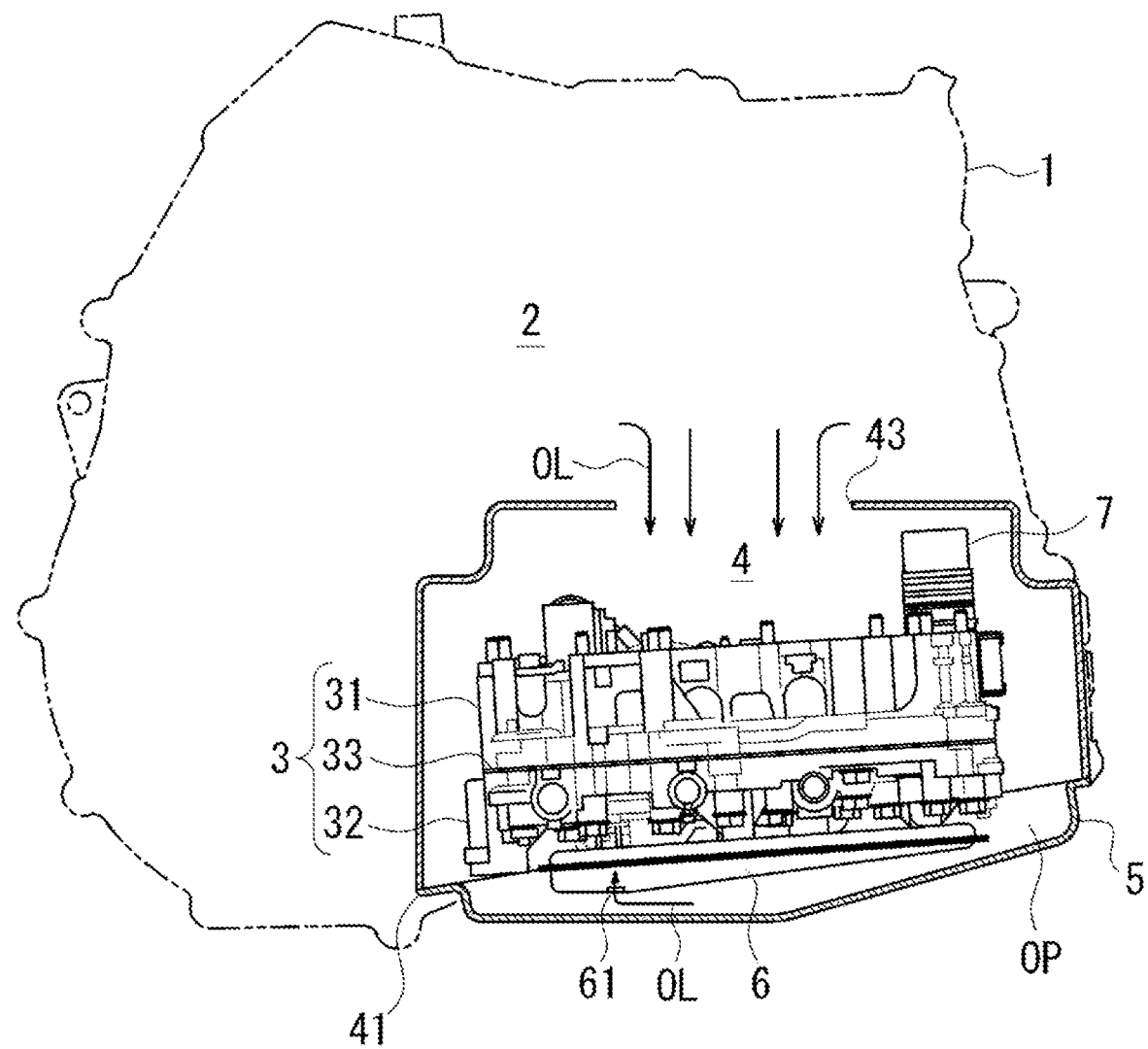
FIG. 1 shows an internal configuration of a case of a power transmission device.

FIG. 1 shows an internal configuration of a case of the power transmission device.

As shown in FIG. 1, the power transmission device has a configuration in which elements constituting the power transmission device are housed in a case 1.

A housing chamber 2 housing components (not shown) constituting a transmission mechanism such as a pulley is formed in an upper portion of the case 1. A valve chamber 4 is formed in a lower portion of the case 1. A lower end of the valve chamber 4 is opened, and an oil pan 5 closes a lower end opening 41 of the valve chamber 4.

In the case 1, oil OL (not shown) used for lubrication, cooling, torque transmission, and the like of components housed in the housing chamber 2 is stored. An oil reservoir OP in which the oil OL retained is formed in a lower portion of the valve chamber 4.

A control valve unit 3 is housed in the valve chamber 4. An oil strainer 6 that filters the oil OL is attached to a lower side of the control valve unit 3, and an oil pump 7 that sucks the oil OL is attached to an upper side of the control valve unit 3. A suction port 61 is provided in a lower portion of the oil strainer 6, and the suction port 61 is located in the oil reservoir OP.

The suction port 61 for the oil OL is provided in the lower portion of the oil strainer 6. When the oil pump 7 is operated, the oil OL in the oil reservoir OP is sucked into the oil pump 7 from the suction port 61 of the oil strainer 6. The oil pump 7 pressurizes the sucked oil OL and supplies the pressurized oil OL to the control valve unit 3.

The control valve unit 3 regulates a pressure of the supplied oil OL, and supplies the regulated oil OL to the transmission mechanism (not shown) in the housing chamber 2 via an oil passage (not shown) in the case. An upper end opening 43 communicating with the housing chamber 2 is provided at an upper end of the valve chamber 4. The oil OL supplied to the transmission mechanism directly falls from the transmission mechanism, or flows along a wall surface of the housing chamber 2, returns to the valve chamber 4 again from the upper end opening 43, and is stored in the oil reservoir OP.

The control valve unit 3 has a configuration in which two bodies of an upper body 31 and a lower body 32 are overlapped. A separate plate 33 is sandwiched between the upper body 31 and the lower body 32. In the valve chamber 4 of the case 1, the upper body 31 is positioned on an upper side, and the lower body 32 is positioned on a lower side.

Although illustration and details are omitted, a hydraulic pressure sensor that detects the pressure of the oil OL, a regulator valve (pressure regulating valve) that regulates a discharge pressure of the oil pump 7 to a predetermined pressure, an oil passage through which the oil OL flows, a spool that switches the oil passage through which the oil OL flows, and the like are provided inside the control valve unit 3.

Figure 2:
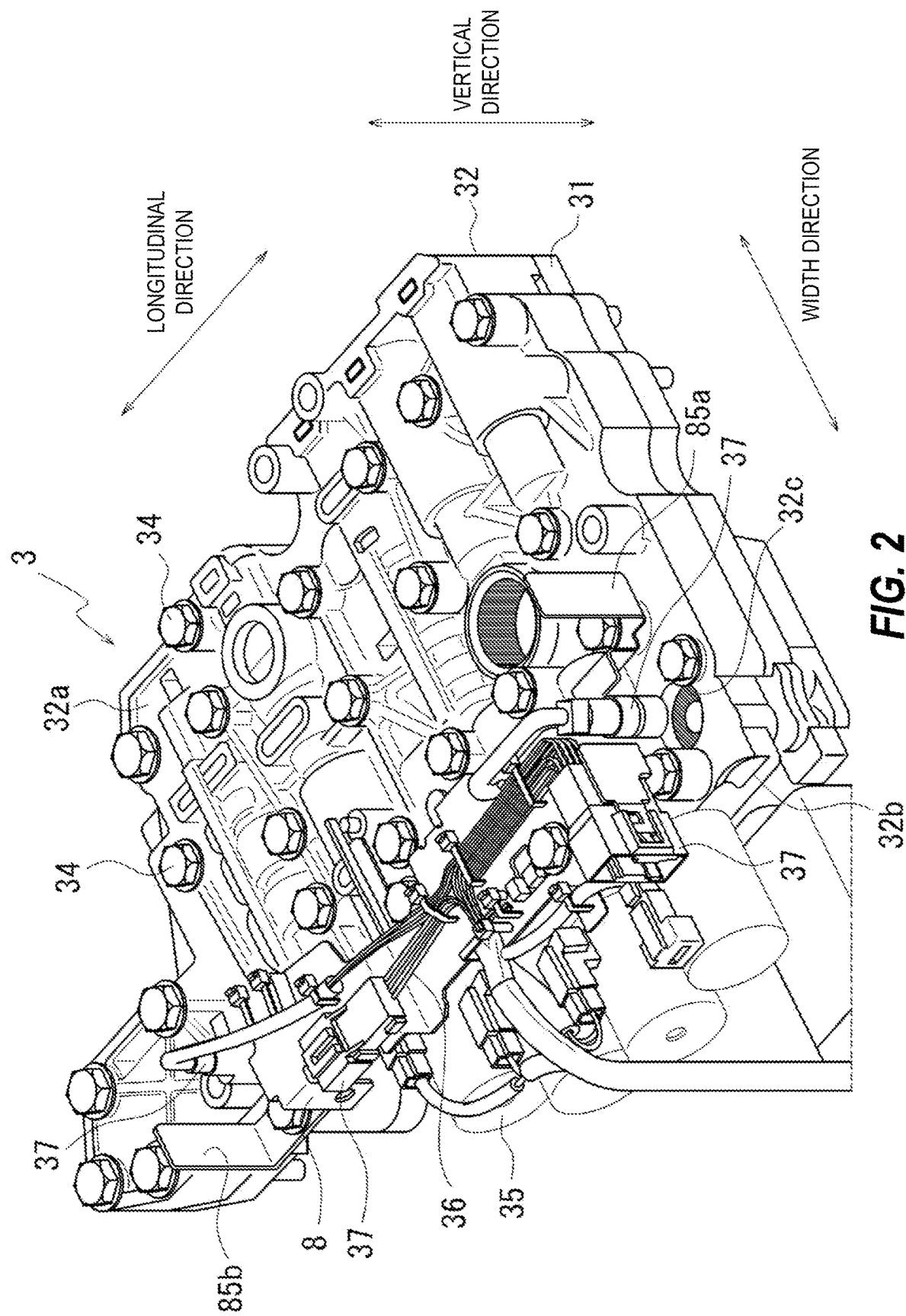
FIG. 2 shows a control valve unit viewed from below.

FIG. 2 shows the control valve unit 3 viewed from the lower body 32 side. In the following description, a direction orthogonal to a longitudinal direction of the lower body 32 on a horizontal plane is referred to as a "width direction", and a direction orthogonal to the longitudinal direction and the width direction is referred to as a "vertical direction".

As shown in FIG. 2, a surface 32a of the lower body 32 is formed with irregularities corresponding to shapes of components, oil passages, and the like provided inside the control valve unit 3. Further, plural bolts 34 for fastening the lower body 32 and the separate plate 33 (see FIG. 1) are arranged at intervals over the entire surface 32a of the lower body 32. A head of each bolt 34 protrudes in the vertical direction from the surface 32a of the lower body 32.

Solenoid valve 35 that switch a flow of the oil OL in the oil passage are assembled to one end surface 32b in the width direction of the lower body 32.

These solenoid valves 35 and electric components such as the hydraulic pressure sensor provided inside the control valve unit 3 are connected to wires 36 such as a power supply line or a signal transmission line via connectors 37.

As shown in FIG. 2, connection ports 32c of the connectors 37 are provided on the surface 32a of the lower body 32. The connectors 37 are electrically connected to the electric components inside the control valve unit 3 via the connection ports 32c.

A wiring board 8 on which the connectors 37 are disposed and the plural wires 36 are bundled and fixed is attached to the lower body 32.

Figure 3:
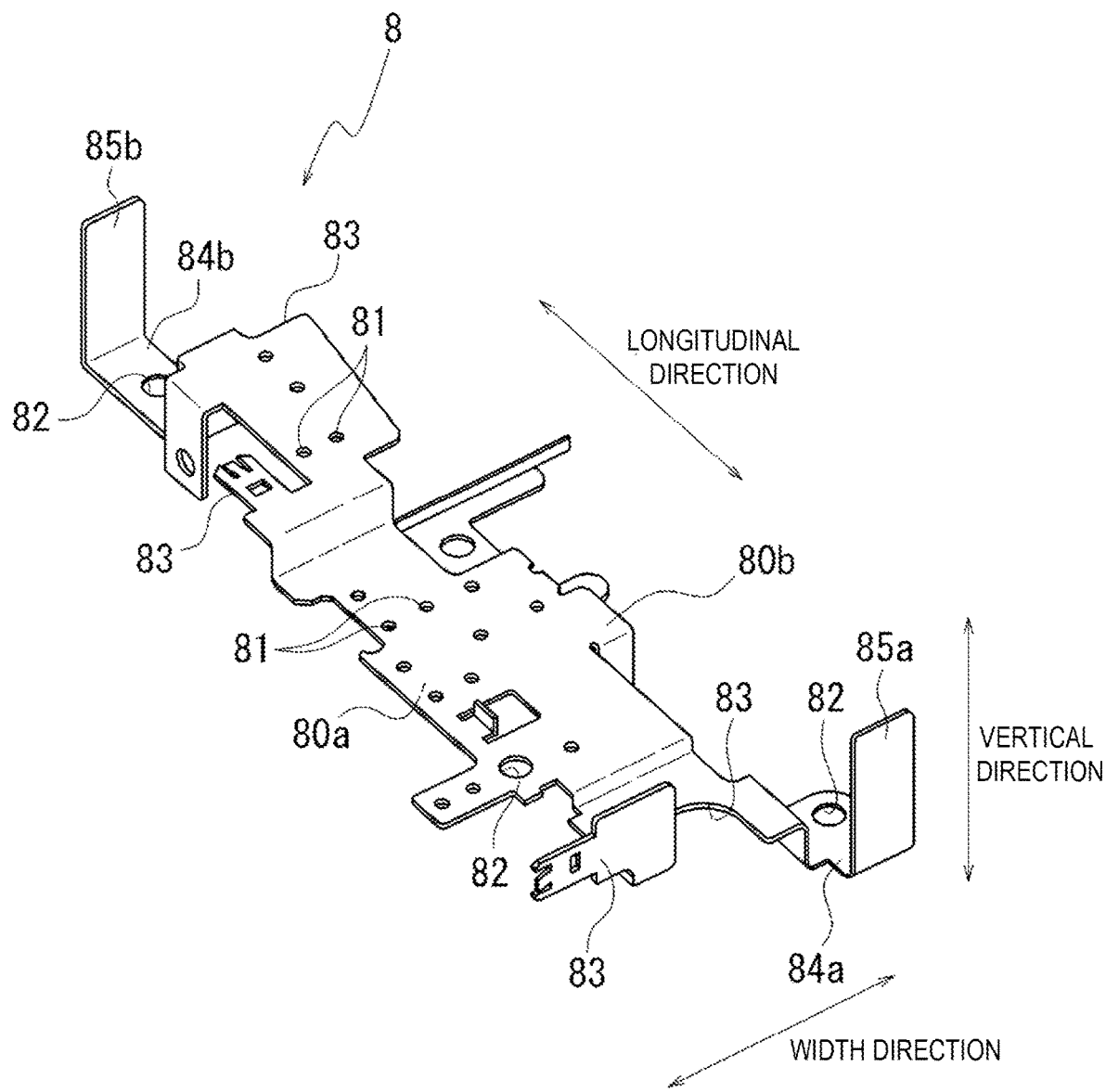
FIG. 3 shows a wiring board.

FIG. 3 shows the wiring board 8.

Figure 4:
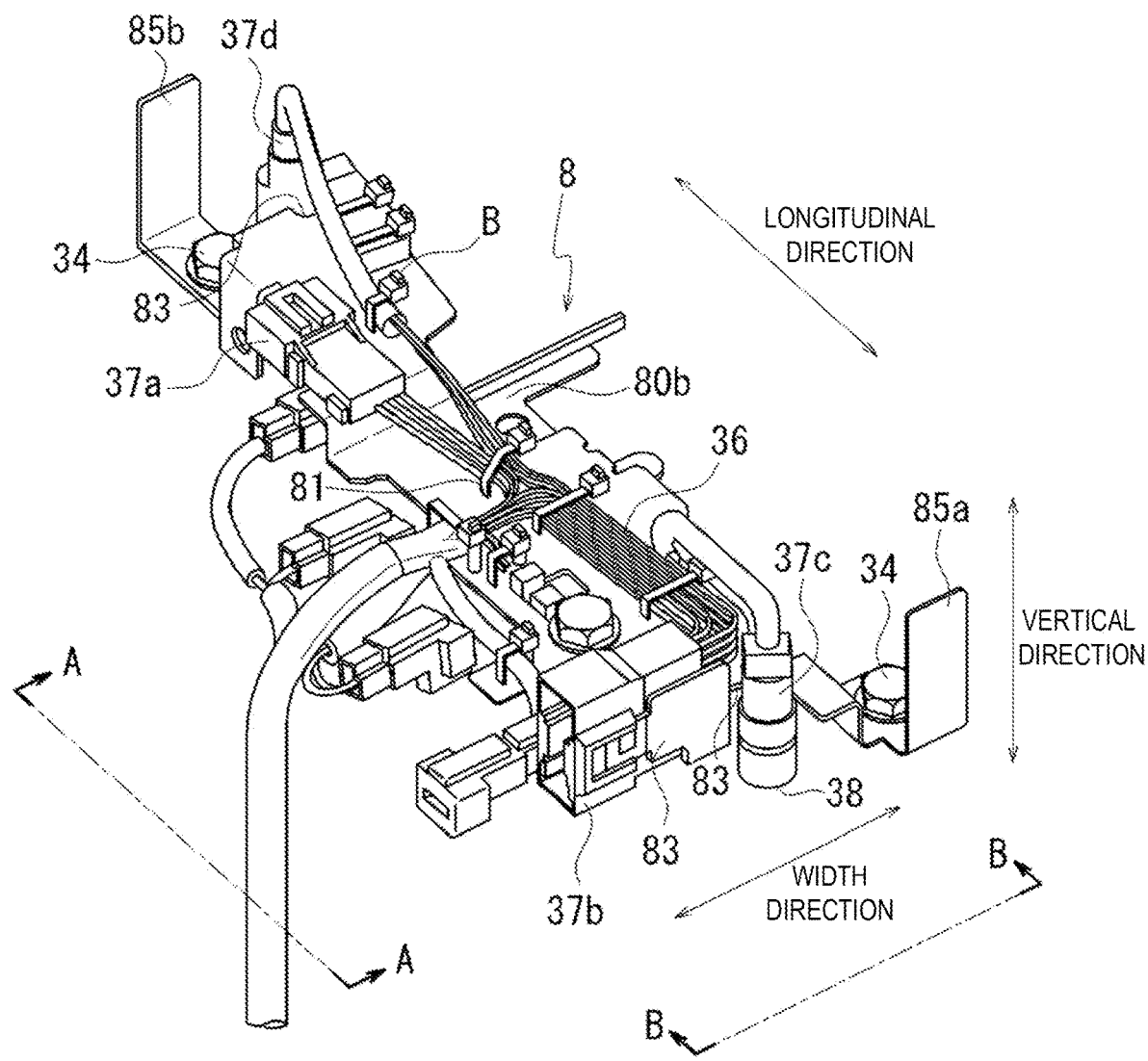
FIG. 4 shows a wiring board in a state where connectors and wired are attached.

FIG. 4 shows the wiring board 8 in a state where the connectors 37 (37a to 37d) and the wires 36 are attached.

Figure 5A:
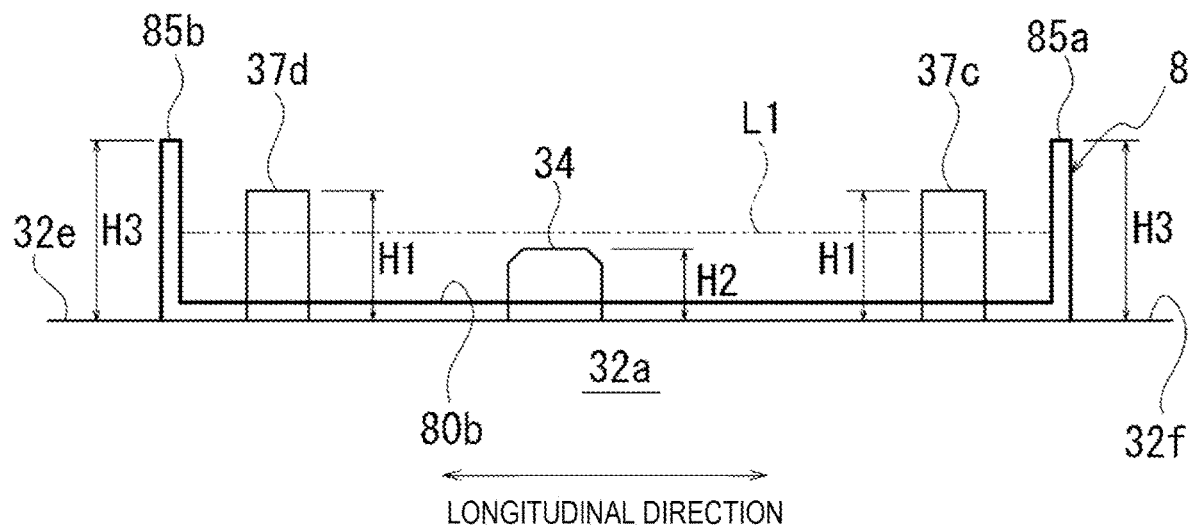
FIG. 5A is a schematic view showing arrangements of legs, connectors, and a bolt, and is a view taken in a direction of arrows A-A in FIG. 4.
Figure 5B:
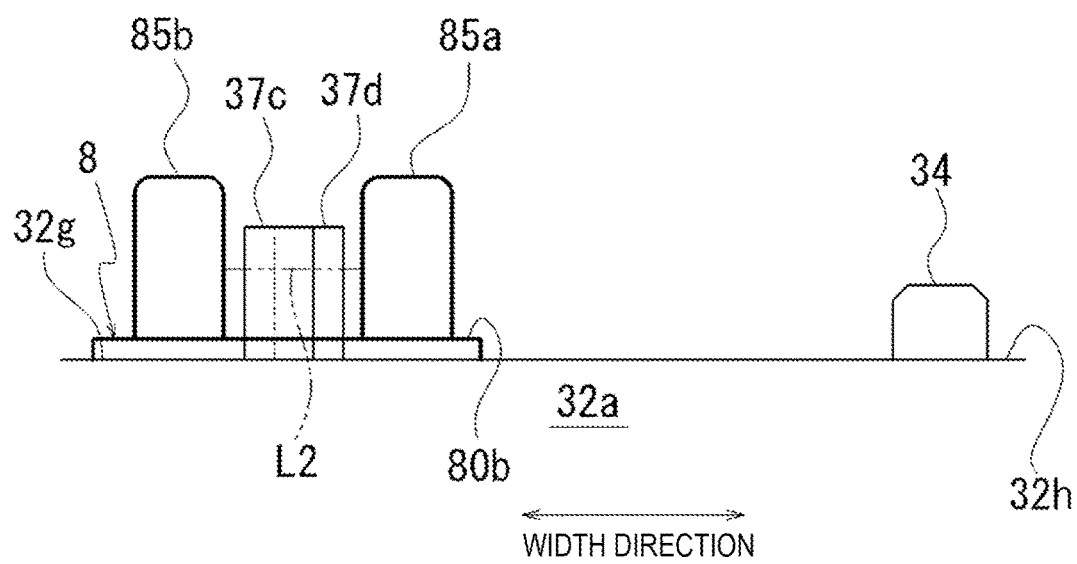
FIG. 5B is a schematic view showing arrangements of the legs, the connectors, and the bolt, and is a view taken in a direction of arrows B-B in FIG. 4.

FIGS. 5A and 5B are schematic views showing arrangements of legs, the connectors 37, and the bolts 34. FIG. 5A is a view taken in a direction of arrows A-A in FIG. 4, and FIG. 5B is a view taken in a direction of arrows B-B in FIG. 4. For easy understanding, FIGS. 5A and 5B are shown as flat surfaces, omitting the irregularities of the surface 32a of the lower body 32 and the wiring board 8. Among the plural bolts 34 (see FIG. 2) attached to the surface 32a of the lower body 32, the bolts 34 shown in FIGS. 5A and 5B are bolts 34 that come into contact with a flat surface F when the lower body 32 is placed on the flat surface F (see FIG. 6A) with the lower body 32 facing downward as described later.

In the following description, when the wiring board 8 is attached to the lower body 32, a facing surface facing the lower body 32 is referred to as a "facing surface 80a", and a back surface on a back side of the facing surface 80a is referred to as a "back surface 80b". FIGS. 3 and 4 illustrate the wiring board 8 viewed from the back surface 80b side.

As shown in FIG. 3, the wiring board 8 is a plate member. The wiring board 8 has a shape conforming to a shape of the lower body 32 having the irregularities. The wiring board 8 is bent at various positions and has notches formed so as not to interfere with the bolts 34 fastened to the lower body 32 or the connection ports 32c (see FIG. 2) of the connectors 37.

As shown in FIG. 5B, the wiring board 8 extends from a vicinity of a center in the width direction of the lower body 32 and extends on the surface 32a of the lower body 32 to a widthwise end portion 32g. A part of the wiring board 8 further extends from the widthwise end portion 32g and covers a part of outer peripheries of the solenoid valves 35 assembled to the one end surface 32b of the lower body 32 as shown in FIG. 2. The surface 32a of the lower body 32 is exposed except for a portion to which the wiring board 8 is attached. As shown in FIG. 5A, both longitudinal end portions 32e and 32f of the surface 32a of the lower body 32 are also exposed. The wiring board 8 is disposed between the lower body 32 and the oil pan 5 (see FIG. 1) that closes the lower end opening 41 of the case 1 when the control valve unit 3 is housed in the case 1 (see FIG. 1).

Although not shown, the wiring board 8 is also attached to the upper body 31 of the control valve unit 3.

As shown in FIG. 3, plural wire fixing portions 81 and plural bolt fastening portions 82 are provided on the surface of the wiring board 8. The wiring fixing portions 81 are formed of rectangular through holes arranged at intervals. The bolt fastening portions 82 are formed of circular through holes through which shafts of the bolts 34 can pass. As shown in FIG. 4, a bands B are bridged over the wire fixing portions 81, and the plural bundled wires 36 are passed through the bands B, whereby the wires 36 are fixed to the wiring board 8. Further, the wiring board 8 is fastened to the lower body 32 via the bolt fastening portions 82.

As shown in FIG. 3, the wiring board 8 is provided with plural connector disposing portions 83 for disposing the connectors 37. The connector disposing portions 83 are formed by a bent portion, a notch, a through hole, and the like of the wiring board 8.

As shown in FIG. 4, the connectors 37 disposed in the connector disposing portions 83 are arranged in a different direction depending on an object to be connected or the like. For example, the connectors 37a and 37b are connected to an external device (not shown) of the control valve unit 3. Therefore, longitudinal directions of the connectors 37a and 37b are parallel to the surface 32a of the lower body 32, and the connectors 37a and 37b are arranged in a "laid state".

On the other hand, in the connectors 37c and 37d disposed in the vicinity of both ends of the wiring board 8, the longitudinal directions of the connectors 37 are perpendicular to the surface 32a of the lower body 32. The connectors 37c and 37d are arranged in a "standing state". As shown in FIG. 2, the connectors 37c and 37d standing in the vertical direction are connected to the connection ports 32c provided in the surface 32a of the lower body 32. That is, each of the connection portions 38 (see FIG. 4) provided at a tip of a terminal portion of each of the connectors 37c and 37d is arranged to face the lower body 32.

As shown in FIG. 5A, when the wiring board 8 is attached to the lower body 32, a vertical length H1 of each of the connectors 37c and 37d is longer than a vertical length H2 of the head of the bolt 34 protruding from the surface 32a of the lower body 32. The connectors 37c and 37d have the same vertical length for the sake of convenience, and may have different lengths.

As shown in FIG. 3, step portions 84a and 84b, which are formed by bending the wiring board 8 in the vertical direction toward the facing surface 80a side, are respectively provided at both end portions of the wiring board 8 in the longitudinal direction. The bolt fastening portions 82 are respectively formed in the step portions 84a and 84b. The wiring board 8 is bent in the vertical direction toward the back surface 80b side on the outside of the bolt fastening portions 82 of the step portions 84a and 84b in the longitudinal direction, and bent portions constitute legs 85a and 85b.

The legs 85a and 85b are plate members having a substantially rectangular shape when viewed in the longitudinal direction. As shown in FIG. 5A, when the wiring board 8 is attached to the lower body 32, the legs 85a and 85b protrude toward the oil pan 5 (see FIG. 1) in the vertical direction from positions offset inward from both longitudinal end portions 32e and 32f of the surface 32a of the lower body 32. The legs 85a and 85b have the same vertical length H3.

As shown in FIG. 5A, the connectors 37c and 37d standing in the vertical direction are arranged on a line segment L1 connecting the legs 85a and 85b provided at the both end portions of the wiring board 8 in the longitudinal direction. As shown in FIG. 5B, the positions of the legs 85a and 85b are also arranged to be shifted in the width direction. The connectors 37c and 37d are arranged on a line segment L2 connecting the legs 85a and 85b. That is, the connectors 37c and 37d are arranged between the legs 85a and 85b when viewed from the width direction and the longitudinal direction.

The vertical length H3 of the legs 85a and 85b is set to be longer than the vertical length H1 of the connectors 37c and 37d. Therefore, the vertical length H2 of the head of the bolt 34 protruding from the surface 32a of the lower body 32 is shorter than the vertical length H3 of the legs 85a and 85b.

The wiring board 8 (not shown) attached to the upper body 31 has the same configuration as that of the wiring board 8 on the lower body 32, but is not provided with the legs 85a and 85b.

Figure 6A:
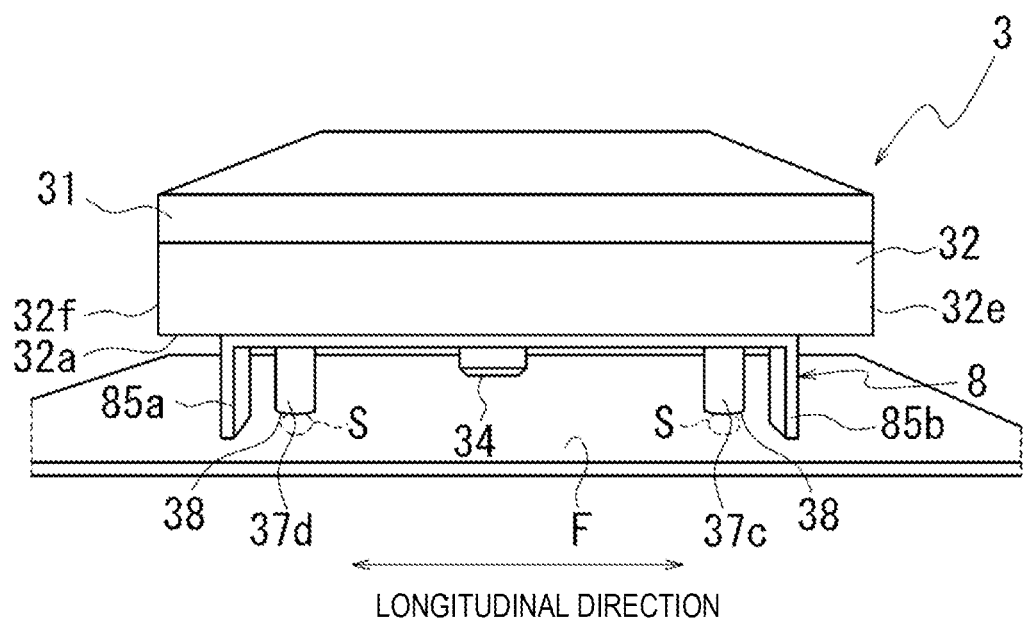
FIG. 6A is a schematic view illustrating an operation of the control valve unit.
Figure 6B:
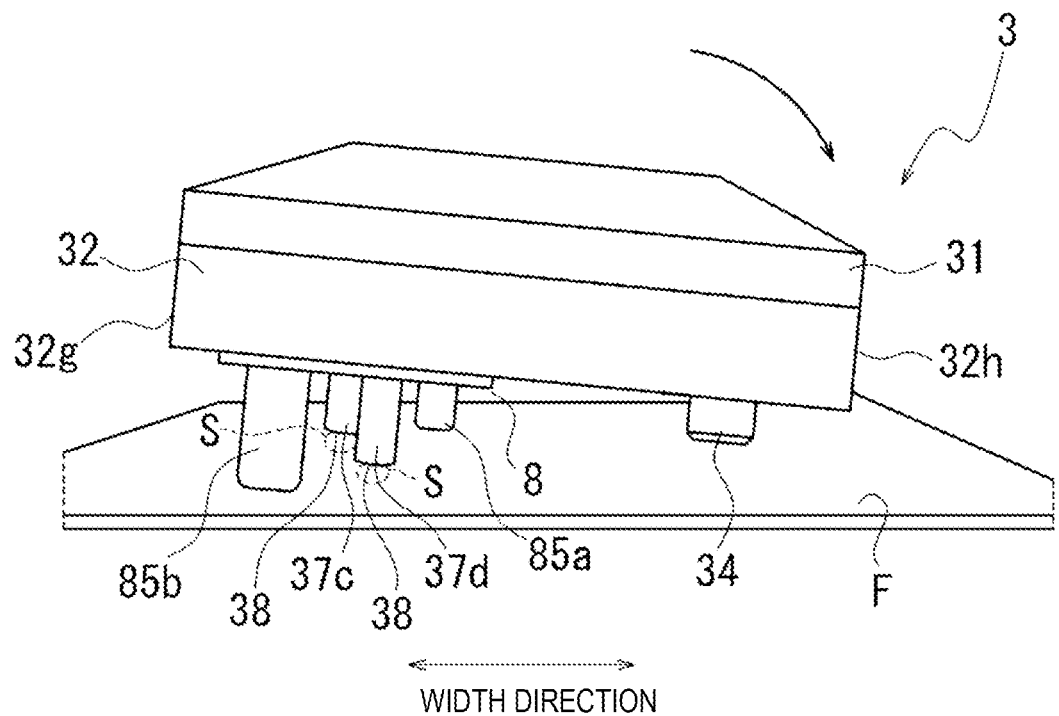
FIG. 6B is a schematic view illustrating an operation of the control valve unit.

FIGS. 6A and 6B are schematic views illustrating an operation of the control valve unit 3 according to the embodiment. FIG. 6A shows a state where FIG. 5A is reversed to a right side of a paper surface with the leg 85a as a fulcrum. FIG. 6B shows a state where FIG. 5B is reversed to a front side of the paper surface.

Figure 7:
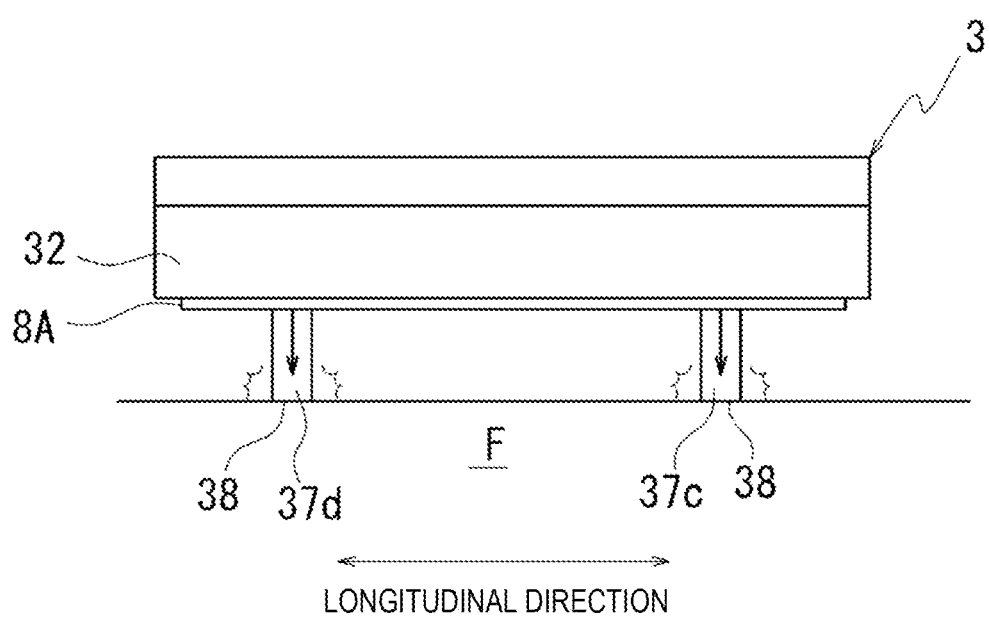
FIG. 7 shows an operation of a control valve unit including a wiring board having no leg as a comparative example.

FIG. 7 shows an operation of the control valve unit 3 including a wiring board 8A having no leg as a comparative example.

During maintenance or the like of the power transmission device, a user such as a maintenance provider places the control valve unit 3 taken out from the case 1 on the flat surface F such as a floor and performs work such as inspection or repair. At this time, as shown in FIG. 6A, normally, the lower body 32 side of the control valve unit 3 faces the flat surface F, that is, a lower side.

The wiring board 8 is attached to the surface 32a of the lower body 32, and the legs 85a and 85b protrude from the wiring board 8 in the vertical direction. Therefore, as shown in FIG. 6B, when the lower body 32 side of the control valve unit 3 is placed on the flat surface F, tips of the protruding legs 85a and 85b come into contact with the flat surface F. The legs 85a and 85b are provided only on one widthwise end portion 32g side with respect to the center of the surface 32a of the lower body 32 in the width direction. Therefore, the control valve unit 3 is inclined toward the other widthwise end portion 32h with two points of the legs 85a and 85b as fulcrums.

As described above, the head of the bolt 34 protrudes in the vertical direction on the surface 32a of the lower body 32. Therefore, when the control valve unit 3 is inclined toward the widthwise end portion 32h, the head of the bolt 34 disposed at the widthwise end portion 32h comes into contact with the flat surface F. Accordingly, the weight of the control valve unit 3 is supported on the flat surface F by three points of the legs 85a and 85b on the widthwise end portion 32g side and the bolt 34 on the widthwise end portion 32h side.

The vertical length H1 of the connectors 37c and 37d disposed between the legs 85a and 85b is shorter than the vertical length H3 of the legs 85a and 85b (see FIG. 5A). Therefore, when the control valve unit 3 is placed with the legs 85a and 85b of the wiring board 8 facing downward, the tips of the legs 85a and 85b are positioned below tips of the connectors 37c and 37d. As shown in FIGS. 6A and 6B, a gap S is formed between the flat surface F and each of the connectors 37c and 37d. Accordingly, the connectors 37c and 37d do not come into contact with the flat surface F.

As shown in the comparative example of FIG. 7, in a case of the wiring board 8A having no leg, the connectors 37c and 37d come into contact with the flat surface F. The weight of the control valve unit 3 is applied to the connectors 37c and 37d. The connectors 37a and 37b in the laid state (see FIG. 4) are relatively easy to withstand the load from the control valve unit 3 since no load is directly applied to the terminal portions of the connectors 37a and 37b. Further, the wires 36 connected to the connectors 37 also have flexibility, and thus are relatively resistant to the load.

On the other hand, the connectors 37c and 37d are disposed in the standing state. The weight of the control valve unit 3 is likely to be applied to the connection portions 38 of the terminal portions of the connectors 37 facing the lower body 32. Therefore, the connectors 37c and 37d tend to be weak against the load from the control valve unit 3 as compared with the connectors 37a and 37b in the laid state.

In the embodiment, as shown in FIGS. 6A and 6B, since the legs 85a and 85b provided on the wiring board 8 come into contact with the flat surface F and receive the weight of the control valve unit 3, the tips of the connectors 37c and 37d do not come into contact with the flat surface F, and it is possible to reduce the load applied to the connectors 37c and 37d.

By disposing the legs 85a and 85b on the wiring board 8, the widthwise end portion 32g side of the lower body 32 on which the connectors 37 are disposed is lifted above the flat surface F. On the other hand, the widthwise end portion 32h side is inclined toward the flat surface F with the tips of the legs 85a and 85b as fulcrums. Accordingly, since the widthwise end portion 32h side of the lower body 32 is supported by the bolt 34 protruding from the surface 32a, it is possible to stably place the lower body 32 on the flat surface F while reducing the load applied to the connectors 37.

Since the legs 85a and 85b are not provided on the widthwise end portion 32h side on which the connectors 37 are not provided, it is possible to avoid an increase in the size of the control valve unit 3 and an increase in the number of components.

In the embodiment, the legs 85a and 85b are provided at two positions of the wiring board 8, but an inclination direction to the widthwise end portion 32h side can be adjusted by adjusting positions of the legs 85a and 85b in the longitudinal direction and the width direction. By adjusting the inclination direction, it is possible to adjust a contact point with the flat surface F on the widthwise end portion 32h side. In the embodiment, the control valve unit 3 can be stably supported while avoiding the increase in the number of components by using the bolt 34 having the load bearing capacity as the contact point.

The legs 85a and 85b also function as gripping portions for lifting the control valve unit 3 during maintenance work. That is, a user grasps the legs 85a and 85b with fingers and takes out the control valve unit 3 from the case 1 to perform maintenance. After the maintenance is completed, the user can grasp the legs 85a and 85b with the fingers, lift the control valve unit 3 to set the control valve unit 3 in the case 1. By providing the legs 85*a* and 85*b* at two positions, the user can easily carry the control valve unit 3. Further, as shown in FIG. 6A, the legs 85*a* and 85*b* are provided to be offset inward with respect to both longitudinal end portions 32*e* and 32*f* of the lower body 32. Therefore, since the fingers grasping the legs 85*a* and 85*b* do not easily interfere with an inner wall of the case 1, the assembly is facilitated.

As described above, the wiring board 8 is attached not only to the lower body 32 but also to the upper body 31, but in the embodiment, an example in which the legs 85*a* and 85*b* are provided only on the wiring board 8 on the lower body 32 has been described. In a case where the legs 85*a* and 85*b* are provided on only one of the two wiring boards 8, there is provided a technical structure that naturally guides a user such as a maintenance company to place a body with a wiring board provided with the legs 85*a* and 85*b* downward, which is also preferable.

As described above, the control valve unit 3 (control unit) of the embodiment includes:

(1) the wiring board 8 provided with the connectors 37.

The connectors 37 are disposed on the back surface 80*b* of the wiring board 8, that is, on a back surface on the back side of the surface (facing surface) 80*a* facing a body of the control unit.

The wiring board 8 includes the legs 85*a* and 85*b* protruding from the back surface 80*b*.

The legs 85*a* and 85*b* of the wiring board 8 are provided on the back surface 80*b* side of the wiring board 8 in the same manner as the connectors 37. Therefore, when the control valve unit 3 is placed on the flat surface F with the connectors 37 facing downward, the legs 85*a* and 85*b* protruding from the back surface 80*b* come into contact with the flat surface F, and thus at least a part of the load acting on the connectors 37 from the control valve unit 3 can be received by the legs 85*a* and 85*b*. Accordingly, it is possible to reduce the load applied to the connectors 37 during maintenance or the like of the control valve unit 3.

(2) The connection portions 38 of the terminal portions of the connectors 37*c* and 37*d* face the lower body 32 (body).

As in the connectors 37*c* and 37*d*, the connection portion 38 of the terminal portion may be disposed toward the lower body 32 of the control valve unit 3. In this case, the longitudinal direction of the connectors 37*c* and 37*d* stands in a direction perpendicular to the surface 32*a* of the control valve unit 3. In such a case, as compared with the case where the longitudinal direction is parallel to the surface 32*a* of the control valve unit 3 as in the connectors 37*a* and 37*b*, that is, the case where the connectors 37*c* and 37*d* are arranged to be laid down, the connectors 37*c* and 37*d* tend to be weak against the load received from the control valve unit 3. Therefore, in such a case, the legs 85*a* and 85*b* provided on the wiring board 8 can receive at least a part of the load applied to the connectors 37*c* and 37*d* from the control valve unit 3.

(3) The lengths of the legs 85*a* and 85*b* are set such that the tips of the legs 85*a* and 85*b* are located below the tips of the connectors 37*c* and 37*d* when the legs 85*a* and 85*b* are placed downward.

Since the tips of the legs 85*a* and 85*b* are located below the tips of the connectors 37*c* and 37*d*, the connectors 37*c* and 37*d* do not come into contact with the flat surface F when the control valve unit 3 is placed on the flat surface F. Since the legs 85*a* and 85*b* receive all of the load from the control valve unit 3, it is possible to reduce a large load applied to the connectors 37*c* and 37*d*.

(4) The connectors 37*c* and 37*d* are disposed on line segments L1 and L2 (straight lines) connecting the two legs 85*a* and 85*b*.

By providing two or more legs 85*a* and 85*b* on the wiring board 8, it is possible to control an inclination direction when the control valve unit 3 is placed on the flat surface F. By arranging the connectors 37*c* and 37*d* on the line segments L1 and L2 connecting the two legs 85*a* and 85*b*, the connectors 37*c* and 37*d* are less likely to come into contact with the flat surface F even when the control valve unit 3 is inclined and placed on the flat surface F with the two legs 85*a* and 85*b* as fulcrums. Accordingly, it is possible to prevent a large load from being applied to the connectors 37*c* and 37*d*.

(5) The legs 85*a* and 85*b* have a shape obtained by bending the end portions of the wiring board 8.

Since the wiring board 8 is formed by being bent in accordance with the shape of the lower body 32 of the control valve unit 3, it is preferable that the legs 85*a* and 85*b* are also formed by bending the end portions of the wiring board 8 so that the legs 85*a* and 85*b* can be formed without increasing the number of components.

(6) The wiring board 8 is disposed between the body and the oil pan 5 (lid portion) of the case 1.

The control valve unit 3 is formed by assembling the upper body 31 located on the upper side in the case 1 and the lower body 32 located on the lower side in the case 1. An opening is provided in the lower portion of the case 1, and the lid portion such as the oil pan 5 closes the opening of the case 1.

During maintenance or the like, the control valve unit 3 is often placed on the flat surface F with the lower body 32 facing downward. Therefore, the load applied to the connectors 37 of the wiring board 8 on the lower body 32 can be reduced by providing the legs 85*a* and 85*b* on the wiring board 8 disposed on the lower body 32 side. In general, the upper body 31 side has less space than the lower body 32 side, and the size of the power transmission device may be large when the legs 85*a* and 85*b* are provided on the upper body 31 side. In this respect as well, it is preferable to provide the legs 85*a* and 85*b* on the lower body 32 side.

(7) The bolts 34, which are protrusions shorter than the legs 85*a* and 85*b*, are disposed on the lower body 32 in a direction in which the legs 85*a* and 85*b* protrude.

It is possible to stably support the control valve unit 3 placed on the flat surface F at plural points of the legs 85*a* and 85*b* and the bolt 34 protruding in the same vertical direction. Since the length of the bolt 34 in the vertical direction can be made shorter than that of the legs 85*a* and 85*b*, it is possible to limit an increase in the size of the power transmission device to a necessary minimum. The protrusion is not limited to the bolt 34, and for example, a protrusion that is a member other than the bolt 34 may be attached to the surface 32*a* of the lower body 32 by welding or the like.

(8) The protrusion is the bolt 34.

An increase in the number of components can be prevented by using the bolt 34 fastened to the lower body 32, and the control valve unit 3 can be stably supported by the bolt 34 having a relatively high load bearing capacity.

(9) The legs 85*a* and 85*b* are offset inward from the longitudinal end portions 32*e* and 32*f* (end portions) of the lower body 32.

The user can grasp the legs 85*a* and 85*b*, take out the control valve unit 3 from the case 1, and set the control valve unit 3 in the case 1. In this case, since the legs 85*a* and 85*b* are offset inward from the longitudinal end portions 32*e* and 32*f* of the body, the fingers of the user grasping the legs 85*a* and 85b do not easily interfere with the inner wall of the case 1 in which the control valve unit 3 is set, and the assembly is facilitated.

The control unit is not limited to the embodiment described above, and can be modified as appropriate.

In the embodiment described above, the example in which the two legs 85a and 85b are disposed on the wiring board 8 has been described, but the number of the leg disposed may be one, or three or more as long as the legs 85a and 85b can receive at least a part of the load applied to the connectors 37. Further, the example in which the legs 85a and 85b are formed by bending the wiring board 8 has been described, but the present invention is not limited thereto. The legs 85a and 85b may be prepared as members separate from the wiring board 8 and attached to the wiring board 8 by welding or the like.

In the embodiment described above, the example in which the vertical length H3 of the legs 85a and 85b is longer than the vertical length H2 of the connectors 37 has been described, but the legs 85a and 85b need only be able to receive at least a part of the load applied to the connectors 37. Therefore, the vertical length H3 of the legs 85a and 85b may be the same as the vertical length H2 of the connectors 37.

The positions at which the legs 85a and 85b are disposed in the wiring board 8 are not limited to those shown in the drawings, and can be appropriately changed according to the position of the connectors 37 disposed in the wiring board 8.

In the embodiment described above, the example in which the legs 85a and 85b are provided on the wiring board 8 of the lower body 32 has been described, but the provision of the legs is not limited to the wiring board 8 on the lower body 32. For example, the legs 85a and 85b may be provided on the wiring board of the upper body 31 in response to a request such as an operation of placing the upper body 31 downward.

In the embodiment described above, the control valve unit 3 of the power transmission device has been described as the control unit, but the control unit is not limited to the control valve unit 3. The control unit is also applicable to other control units such as an inverter unit provided for controlling a driving motor of an electric vehicle or a hybrid vehicle.

A power transmission device such as the transmission including the control valve unit 3 and the wiring board 8 is also included in the scope of the present invention.

The present application claims a priority of Japanese Patent Application No. 2019-106154 filed with the Japan Patent Office on Jun. 6, 2019, all the contents of which are hereby incorporated by reference.

REFERENCE SIGN LIST 1 case
2 housing chamber
3 control valve body (control unit)
31 upper body
32 lower body
32e, 32f longitudinal end portion
33 separate plate
34 bolt
36 wire
37a, 37b, 37c, 37d connector
38 connection portion
4 valve chamber
5 oil pan
6 oil strainer
7 oil pump
8 wiring board
80a facing surface (surface facing the body of the control unit)
80b back surface (surface on the back side of the facing surface facing the body of the control unit)
81 wire fixing portion
82 bolt fastening portion
83 connector disposing portion
85a, 85b leg

What is claimed is:

1. A control unit comprising:
a wiring board comprising a plate member, on which a connector and plural wires are disposed, wherein
the connector is disposed on a back surface of the wiring board, the back surface being a surface on a back side of a facing surface of the wiring board facing a body of the control unit,
the plural wires are bundled and fixed to the wiring board,
the wiring board includes two legs protruding from the back surface on the back side of the facing surface facing the body,
the connector is disposed between the two legs when viewed in a longitudinal direction of the body and when viewed in a width direction of the body,
lengths of the legs are set such that tips of the legs are located below a tip of the connector when the legs are placed downward; and
the control unit is one of a control valve unit for hydraulic control of a transmission or an inverter for controlling a motor.

2. The control unit according to claim 1, wherein
a connection portion of a terminal portion of the connector faces the body.

3. The control unit according to claim 1, wherein
the legs have a shape obtained by bending an end portion of the wiring board.

4. The control unit according to claim 1, wherein
the wiring board is disposed between the body and a lid portion of a case.

5. The control unit according to claim 1, further comprising:
a protrusion shorter than the legs on the body in a direction in which the legs protrude.

6. The control unit according to claim 5, wherein
the protrusion is a bolt.

7. The control unit according to claim 1, wherein
the legs are offset inward from an end portion of the body.

8. The control unit according to claim 1, wherein
the control unit is a control valve unit or an inverter unit.

* * * * *